United States Patent [19]

Sugai et al.

[11] Patent Number: 5,793,479
[45] Date of Patent: Aug. 11, 1998

[54] THIN-FILM FORMATION DEVICE AND METHOD

[75] Inventors: Kazumi Sugai; Shunji Kishida; Akiko Kobayashi, all of Tokyo, Japan

[73] Assignee: NEC Corporation, Tokyo, Japan

[21] Appl. No.: 882,106

[22] Filed: Jun. 25, 1997

Related U.S. Application Data

[63] Continuation of Ser. No. 509,633, Jul. 31, 1995, abandoned.

[30] Foreign Application Priority Data

Jul. 29, 1994 [JP] Japan .................................. 6-177351

[51] Int. Cl.$^6$ .......................... G01B 11/06; G01B 11/30
[52] U.S. Cl. .......................... 356/72; 356/371; 356/381; 250/559.27
[58] Field of Search .......................... 356/371, 381, 356/382, 72; 250/559.27

[56] References Cited

U.S. PATENT DOCUMENTS

| 3,892,490 | 7/1975 | Uetsuki et al. . | |
|---|---|---|---|
| 4,676,646 | 6/1987 | Strand et al. | 356/381 |
| 5,000,575 | 3/1991 | Southwell et al. | 356/382 |
| 5,396,080 | 3/1995 | Hannotiau et al. | 356/381 |

FOREIGN PATENT DOCUMENTS

| 0 061 237 | 9/1982 | European Pat. Off. . |
| 0 552 648 | 7/1993 | European Pat. Off. . |
| 62776 | 8/1949 | United Kingdom . |
| 2 189 881 | 11/1987 | United Kingdom . |
| 2 192 902 | 1/1988 | United Kingdom . |
| WO 91/20093 | 12/1991 | WIPO . |

OTHER PUBLICATIONS

R. Levy et al., "Characterization of LPCVD Aluminum for VLSI Processing", Electrochemical Society, Sep. 1984, vol. 131, No. 9, pp. 2175–2183.

A. Sekiguchi et al., "Gas-Temperature-Controlled (GTC) CVD of Aluminum and Aluminum-Silicon Alloy Film for VLSI Processing", Japanese Journal of Applied Physics, Nov. 1988, vol. 27, No. 11, pp. L2134–L2136.

K. Masu et al., "Selective deposition of aluminum from selectively excited metalorganic source by the rf plasma", Applied Physic Letters, Apr. 16, 1990, vol. 56, No. 16, pp. 1543–1545.

Japanese Applied Physics, 1992, vol. 61, No. 2, pp. 173–174.

T. Amazawa et al., "A 0.25μm Via Plug Process Using Selective CVD Aluminum for Multilevel Interconnection", IEEE, 1991, pp. 265–266.

D. Aspnes et al., Optical-Reflectance and Electron-Diffraction Studies of Molecular-Beam-Epitaxy Growth Transients on GaAs(001), Physical Review Letters, Oct. 12, 1987, vol. 59, No. 15, pp. 1687–1690.

*Primary Examiner*—F. L. Evans
*Attorney, Agent, or Firm*—Young & Thompson

[57] ABSTRACT

Disclosed is a thin-film formation device which has a light irradiating optical system 13 for irradiating a light of predetermined intensity to the substrate 21 which is subject to film formation, a light detecting optical system 14 for detecting the intensity of the reflected light from the surface of the substrate 21, and a thin-film formation controller 15 which stops the film formation by controlling a material introducing system 11 when the intensity of reflected light takes a maximum value. The device is so arranged that the film formation operation can be stopped when the intensity of reflected light takes a maximum value thereby providing a smoothest thin film.

19 Claims, 6 Drawing Sheets

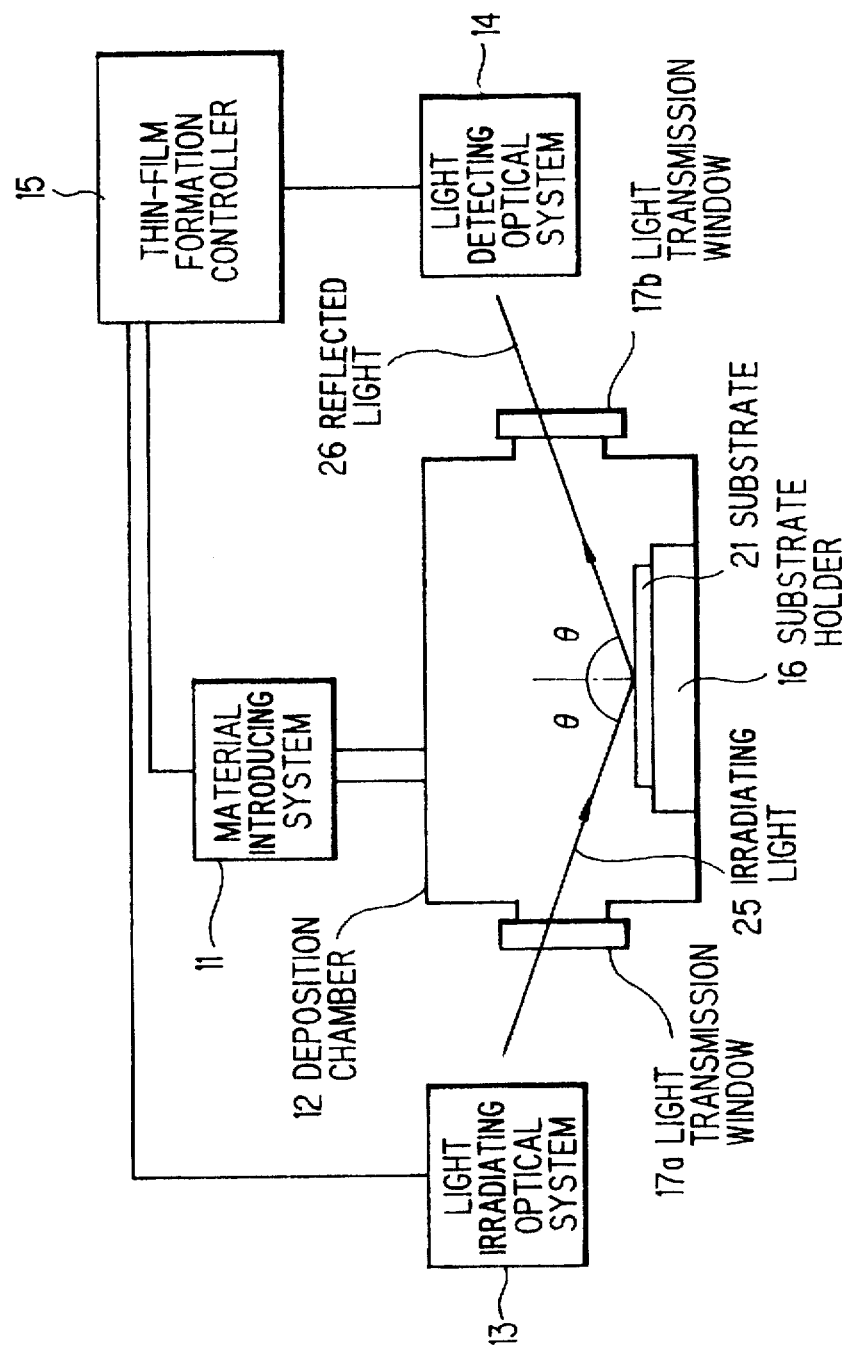

5,793,479

THIN-FILM FORMATION DEVICE AND METHOD

This application is a continuation of application Ser. No. 08/509,633, filed Jul. 31, 1995, now abandoned.

FIELD OF THE INVENTION

This invention relates to a thin-film formation device and method, and more particularly to, a thin-film formation device and method for forming a thin film with a smooth surface on a substrate.

BACKGROUND OF THE INVENTION

Various devices for forming a thin film on a substrate are known. For example, to provide a film having a high step-coverage, a device which forms a thin film by a chemical vapor deposition (CVD) is used. These devices are properly used depending on properties of film to be required.

However, when a smooth thin film is exactly provided by the conventional devices, it is necessary to predetermine the condition by which a smoothest thin film can be formed. It requires that a lot of films be tested under various conditions.

SUMMARY OF THE INVENTION

Accordingly, it is an object of the invention to provide a thin-film formation device and method by which a thin-film having a smoothest surface can be easily obtained with good reproducibility.

It is a further object of the invention to provide a thin-film formation device and method by which a relatively thick smooth thin-film can be easily obtained.

It is a still further object of the invention to provide a thin-film formation device and method by which a smooth thin film which is well formed along the concave or convex portion of a substrate can be easily obtained.

According to the invention, a thin-film formation device, comprises:

means for forming a thin film on a substrate;

means for irradiating a light onto a surface of the substrate;

means for detecting a intensity of light reflected by at least one of the surface of the substrate and a surface of the thin film; and means for stopping the formation of the thin film by the thin-film formation means when the reflected light detection means detects a maximum value of the intensity of the reflected light.

Namely, in accordance with the invention as defined above, the thin-film formation device is so arranged that the film formation operation can be stopped when the intensity of reflected light takes a maximum value on the basis that the intensity of reflected light depends on the surface condition of the thin film.

Further, according to the invention, a thin-film formation device, comprises:

means for forming a first thin film on a substrate;

means for forming a second thin film on the substrate, wherein the second thin film is made of a material different from that for forming the first thin film;

means for irradiating a light onto a surface of the substrate, the light means for detecting a intensity of a reflected light which light reflected by at least one of the surface of the substrate and a surface of the second thin film; and control means for stopping the formation of the first thin film by the first thin-film formation means when the reflected light detection means detects a maximum value of the intensity of the reflected light, then forming the second thin film by the first thin-film formation means for a predetermined time, thereafter again forming the first thin film by the first thin-film formation means.

Namely, in accordance with the invention as defined above, the thin-film formation device is also arranged so that the surface condition of the first thin film can be monitored on the basis of the variation of the intensity of reflected light to film-formation time and the second thin film made of a different material can be formed on the first thin film when the first thin film is determined to be a morphologically smooth film by the monitoring thereafter continuing to form the first thin film. The second thin film formed by the second thin-film formation means is not always a continuous film.

The surface of the thin film on which first thin film is again formed after the formation of the second thin film is reformed by the formation of the second thin film. As a result of the reformation, the density of nuclei which are grown on the reformed thin film becomes larger than that of nuclei obtained when a thin film is continuously formed without the reformation. Therefore, the surface of thin film becomes smoother.

In the above-mentioned inventions, it is desirable that the (first) thin film formed by the (first) thin-film formation device is polycrystalline film since the variation of the intensity of reflected light to film-formation time becomes significant. Besides, when thin film is formed on the substrate which has a concave or convex portion, it is desirable that a chemical vapor deposition (CVD) method is employed. The CVD method can prevent thin film from occurring a relatively big void as to the substrate on which a contact hole or a groove for interconnects line having a high aspect ratio exists.

In the latter of the above-mentioned inventions, when the first thin film is made of a material mainly including aluminum and the second thin film is made of a material mainly including titanium, a smoothest thin film can be obtained.

Further, according to the invention, a thin-film formation method, comprises the steps of:

forming a thin film on a substrate;

irradiating a light onto a surface of the substrate detecting an intensity of light by at least one of the surface of the substrate and a surface of the second thin film; and stopping the formation of the thin film when the intensity of the reflected light reaches a maximum value.

Still further, according to the invention, a thin-film formation method, comprises the steps of:

forming a first thin film on a substrate;

irradiating a light onto a surface of the substrate, detecting an intensity of light reflected by the surface of the substrate;

stopping the formation of the first thin film when the intensity of the reflected light reaches a maximum value;

forming a second thin film on the first thin film, the second thin film being made of a material different from that of the first thin film; and again forming the first thin film on the second thin film after forming the second thin film for a predetermined time.

BRIEF DESCRIPTION OF THE DRAWINGS

The invention will be explained in more detail in conjunction with the appended drawings, wherein:

FIG. 1 is a schematic diagram showing a thin-film formation device in the first embodiment of the invention.

DESCRIPTION OF THE PREFERRED EMBODIMENTS

Figure 2A:
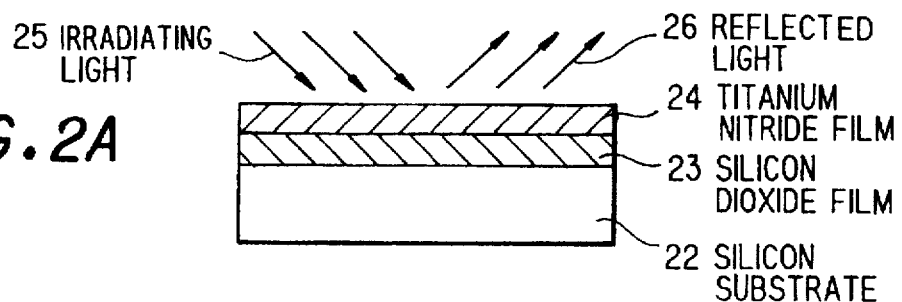
FIGS. 2A–2E are cross sectional views of a substrate showing the process in which an aluminum thin film is formed on the substrate when the device in the first embodiment of the invention is employed in the formation of aluminum thin film on a silicon integrated circuit.

FIG. 1 schematically shows a thin-film formation device in the first embodiment of the invention. The device for the formation of aluminum thin films by a chemical vapor deposition (CVD) method comprises a material introducing system 11, a deposition chamber 12, a light irradiating optical system 13, a light detecting optical system 14 and a thin-film formation controller 15.

The material introducing system 11 introduces aluminum into the deposition chamber 12. Depending on the control signals from the thin-film formation controller 15, it controls on/off of the introduction of aluminum into the deposition chamber 12. In this embodiment, dimethylaluminumhydride is used as a material of aluminum. Dimethylaluminumhydride is bubbled with hydrogen gas at a flow rate of 300 sccm in the material introducing system 11, thereafter being fed into the deposition chamber 12.

When the material is introduced, the pressure within the deposition chamber 12 is reduced to about 1 Torr by an exhaust (not shown). Dimethylaluminumhydride fed into the deposition chamber 12 is then deposited on a substrate 21 which is heated by a substrate holder 16 to a temperature of about 170° C.

The light irradiating optical system 13 and light detecting optical system 14 are systems for monitoring the surface condition of the substrate 21 during the deposition. The light irradiating optical system 13 irradiates a light with a constant intensity, and the light detecting system 14 outputs the electrical signals depending on the intensity of the detected light. These optical systems are so disposed that the light irradiated from the light irradiating optical system 13 to the deposition chamber 12 is transmitted through a light transmission window 17a to reach the surface of the substrate 21 and the light reflected regularly on the surface of the substrate 21 is transmitted through a light transmission window 17b to be detected by the light detecting optical system 14. In this embodiment, the light irradiating optical system 13 employs a He—Ne laser which outputs a light of 6328 Å, and on and off of the light irradiating optical system 13 can be controlled by the thin-film formation controller 15.

The thin-film formation controller 15 is a controller which employs a CPU, and it can control the other components in the device with a process as described below to form a smooth, thin film on the substrate 21.

When the instruction for making a thin film is given, the thin-film formation controller 15 first controls the light irradiating optical system 13 to emit a light onto the substrate 21 as well as to start the monitoring by the light detecting optical system 14. After confirming that the light irradiating optical system 13 and the light detecting optical system 14 are regularly operated, it will control the material introducing system 11 to start the introduction of a material into the deposition chamber 12.

Thereafter, on the basis of a signal which is output from the light detecting optical system 14, it will continue to monitor the intensity of reflected light. When the intensity of reflected light reaches maximum value, feeding of the material by the material introducing system 11 will be stopped.

Figure 2B:
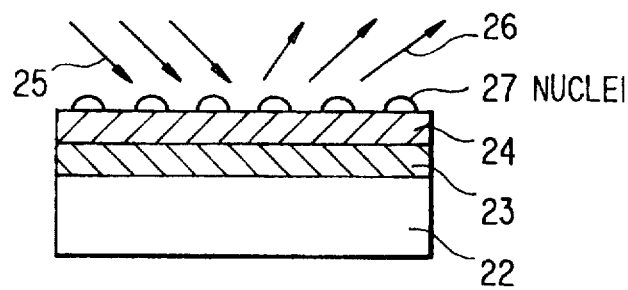
Figure 2C:
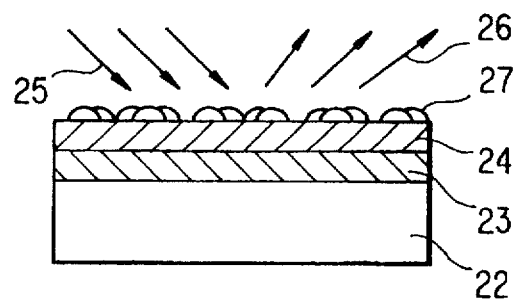
Figure 2D:
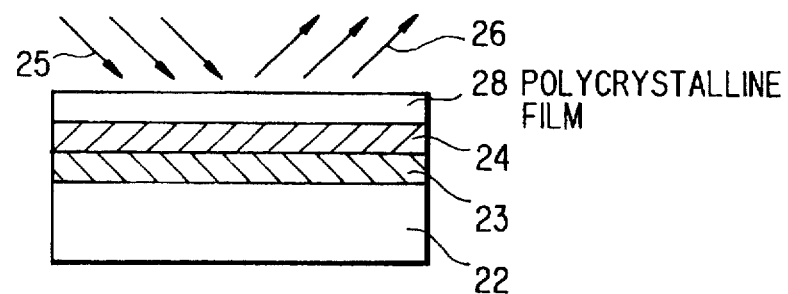
Figure 2E:
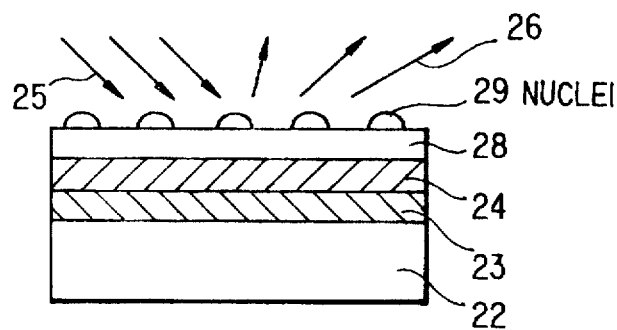
Figure 3:
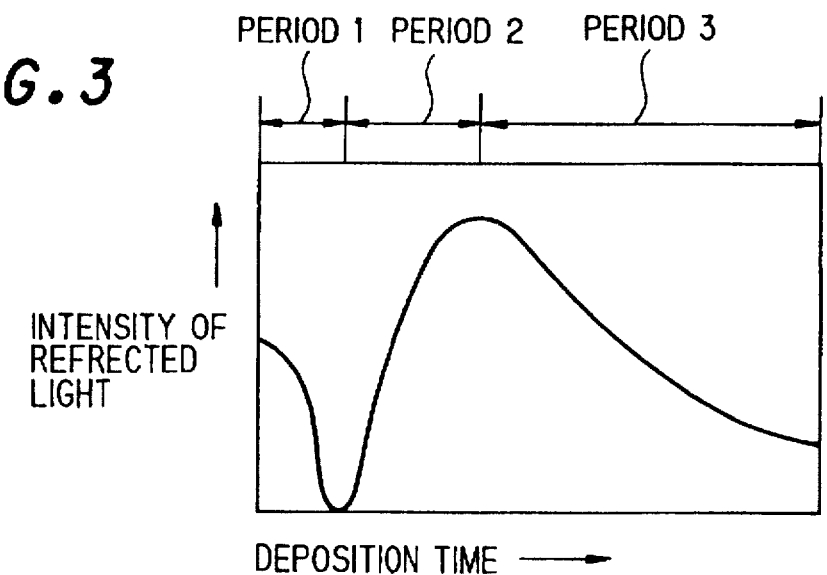
FIG. 3 is a graph showing the variation of the intensity of reflected light to deposition time during the thin-film formation in FIGS. 2A–2E.

With reference to FIGS. 2A–2E and 3, the operation of the thin-film formation device in the first embodiment will be further explained. FIGS. 2A–2E illustrate schematically the procedures in which an aluminum thin film will be formed on the substrate when the device is employed in the formation of the aluminum thin film in a silicon integrated circuit. FIG. 3 is a graph showing the variation of the intensity (output of the light detecting optical system) of reflected light to the deposition time in the procedures of the thin-film formation.

In the application to the silicon integrated circuit, the substrate to be deposited an aluminum film thereon may employ a silicon substrate 22 on which a silicon dioxide film 23 and titanium nitride film 24 are formed as shown in FIG. 2A. Since the surface of the titanium nitride film 24 is in general sufficiently smooth, the scattering on the surface of the titanium nitride film 24 (i.e. on the surface of the substrate) does not occur at the beginning of the formation of the aluminum film as illustrated in FIG. 2A. Therefore, a reflecting light 26 which has the intensity depending on the reflection factor of the titanium nitride film 24 is detected by the light detecting optical system 14.

As the formation of the aluminum film is proceeded thereafter, nuclei 27 of aluminum are grown on the surface of the titanium nitride film 12 as shown in FIG. 2B. Since the size of the respective aluminum nuclei 27 is well bigger than a half of the wave length of the irradiating light 25, the irradiating light 25 will be scattered on the surface of the substrate. Therefore, as time goes by, the intensity of reflected light, the initial value of which is determined by the reflection factor of titanium nitride, will be reduced in accordance with the increase of the number of the aluminum nuclei and growth thereof as shown in FIG. 3, Period 1. When the formation of the aluminum film is further proceeded, incorporation of aluminum nuclei 27 occurs while increasing the proportion occupied with aluminum on the substrate, and the surface of the aluminum film becomes relatively smooth as illustrated in FIG. 2C. Thereafter, as shown in FIG. 2D, when the whole surface of the substrate is covered with a polycrystalline film 28 of aluminum, the surface thereof becomes smoothest.

Namely, in the process from FIG. 2C to FIG. 2D, the scattering is reduced and the proportion of aluminum which has higher reflection factor than titanium nitride to the substrate surface increases. Thus, the intensity of reflected light tends to be increased as shown in FIG. 3, Period 2.

When the formation of aluminum film is further proceeded, second aluminum nuclei 29 is formed on the polycrystalline aluminum film 28 as shown in FIG. 2E and the intensity of reflected light is reduced again as shown in FIG. 3, Period 3. However, in the thin-film forming device in this embodiment, when the intensity of reflected light reaches maximum value, the introducing of the material is stopped. Therefore, the smooth surface film as shown in FIG. 2D is surely obtained.

Meanwhile, aluminum nuclei 29 which are formed at the stage as shown in FIG. 2E are still bigger than aluminum nuclei 27 which are first formed on the titanium nitride film, and the growth of thin film thereafter is proceeded by a different mechanism from that of the thin-film growth on titanium nitride film. Therefore, the surface of the thin film grown thereon could not be smooth. On the other hand, an aluminum material useful for forming an aluminum thin film by the device of the invention is not limited to dimethylaluminumhydride and may include triisobutylaluminum, trimethylamine alane etc.

The irradiating light optical system may employ various lasers other than a He—Ne laser or a lamp, a LED or light sources not using a laser light. Furthermore, a monitoring system which monitors the intensity of the light irradiated from a light source may be provided. Since the ratio of the monitored value and a value determined by the light detecting optical system may be used as the intensity of reflected light, it is possible to use even a light source in which the intensity of the irradiated light may change.

The thin-film forming device in this embodiment may be applied for making a thin film of a material other than aluminum, such as a metal film of gold, silver or titanium, a metal alloy film of titanium nitride, aluminum-copper alloy or a semiconductor film. The substrate is not limited to a silicon substrate.

In the case that the device of the invention is applied for the other materials as mentioned above, if the size of nuclei formed on the substrate and nuclei formed on the deposited film thereon is sufficient to scatter the irradiating light, i.e., bigger than a half of the wave length of the irradiating light and the reflection factor of the substrate, $R_{SUB}$ and the reflection factor of thin film to be formed on the substrate, $R_{FILM}$ satisfy the relation $R_{SUB} < R_{FILM}$, then the intensity and variation to deposition time property of reflected light (refer to FIG. 3) will be similar to those of the aluminum film. Therefore, a thin film having a smooth surface may be provided by stopping the film formation when the intensity of reflected light has a maximum value.

Figure 4:
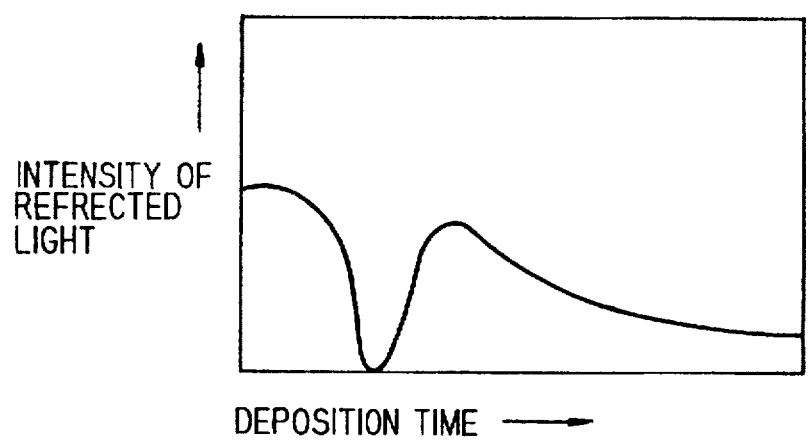
FIG. 4 is a graph showing the variation of the intensity of reflected light to deposition time in the case that the size of nuclei formed on the substrate and nuclei formed on the deposited film thereon is sufficient to scatter the irradiating light, and the reflection factor of the substrate, $R_{SUB}$ and the reflection factor of thin film to be formed on the substrate, $R_{FILM}$ satisfy the relation $R_{SUB}>R_{FILM}$.

Next, if the size of nuclei formed on the substrate and nuclei formed on the deposited film thereon is sufficient to scatter the irradiating light and the reflection factor of the substrate, $R_{SUB}$ and the reflection factor of thin film to be formed on the substrate, $R_{FILM}$ satisfy the relation $R_{SUB} > R_{FILM}$, then the intensity of reflected light at maximum, as shown in FIG. 4, is less than the initial intensity of reflected light, but a similar property that the intensity of reflected light has a minimum value followed by having a maximum value is obtained.

As described above, if the size of nuclei formed on the substrate and nuclei formed on the deposited film thereon is sufficient to scatter the irradiating light, then the intensity of reflected light has a maximum value regardless of the relationship between the reflection factor of the substrate and that of thin film. Therefore, a thin film having a smooth surface may be provided by the thin-film formation device in this embodiment.

Figure 5:
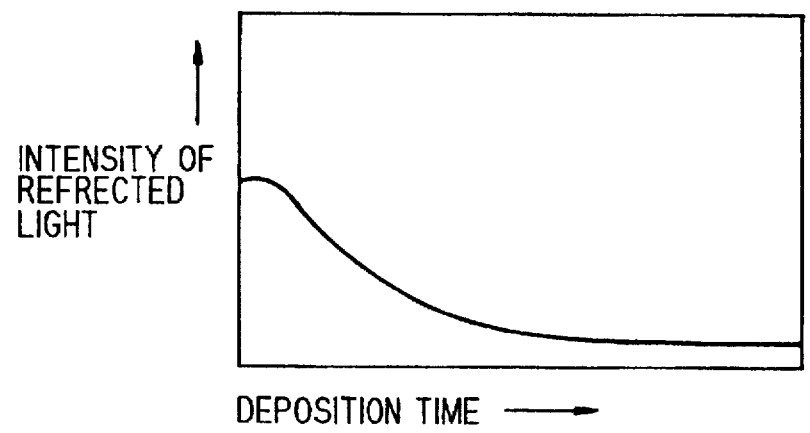
FIG. 5 a graph showing the variation of the intensity of reflected light to deposition time in the case that the size of nuclei formed on the substrate is sufficient to scatter the irradiating light and the relation $R_{SUB}>R_{FILM}$ is satisfied.

If the size of nuclei formed on the substrate is not sufficient to scatter the irradiating light and the relation $R_{SUB} > R_{FILM}$ is established, then the intensity of reflected light, as shown in FIG. 5, does not have a maximum value during the formation of thin film. Thus, it is impossible for the thin-film formation device in this embodiment to stop the film formation at the stage where a thin film having smooth surface is obtained.

Figure 6:
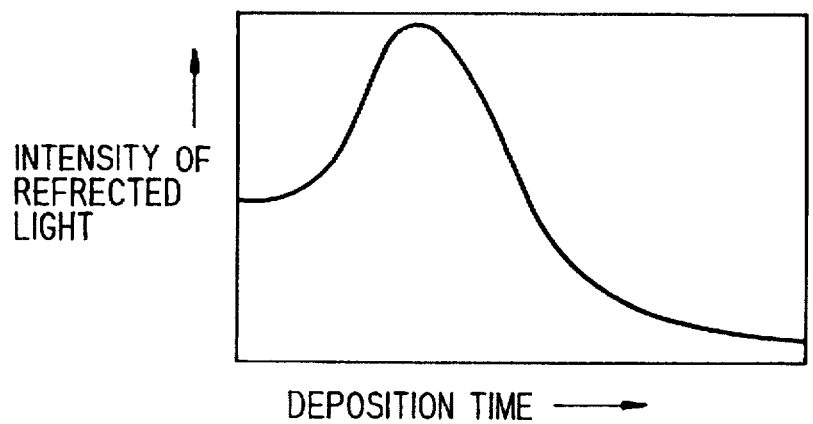
FIG. 6 is a graph showing the variation of the intensity of reflected light to deposition time in the case that the size of nuclei formed on the substrate is sufficient to scatter the irradiating light and the relation $R_{SUB}<R_{FILM}$ is satisfied.

However, when the relation $R_{SUB} < R_{FILM}$ is established, the intensity of reflected light, as shown in FIG. 6, has a maximum value even if the size of nuclei formed on the substrate is not sufficient to scatter the irradiated light. Therefore, a thin film having a smooth surface may be provided by the thin-film formation device in this embodiment.

EXAMPLE 2

Figure 7:
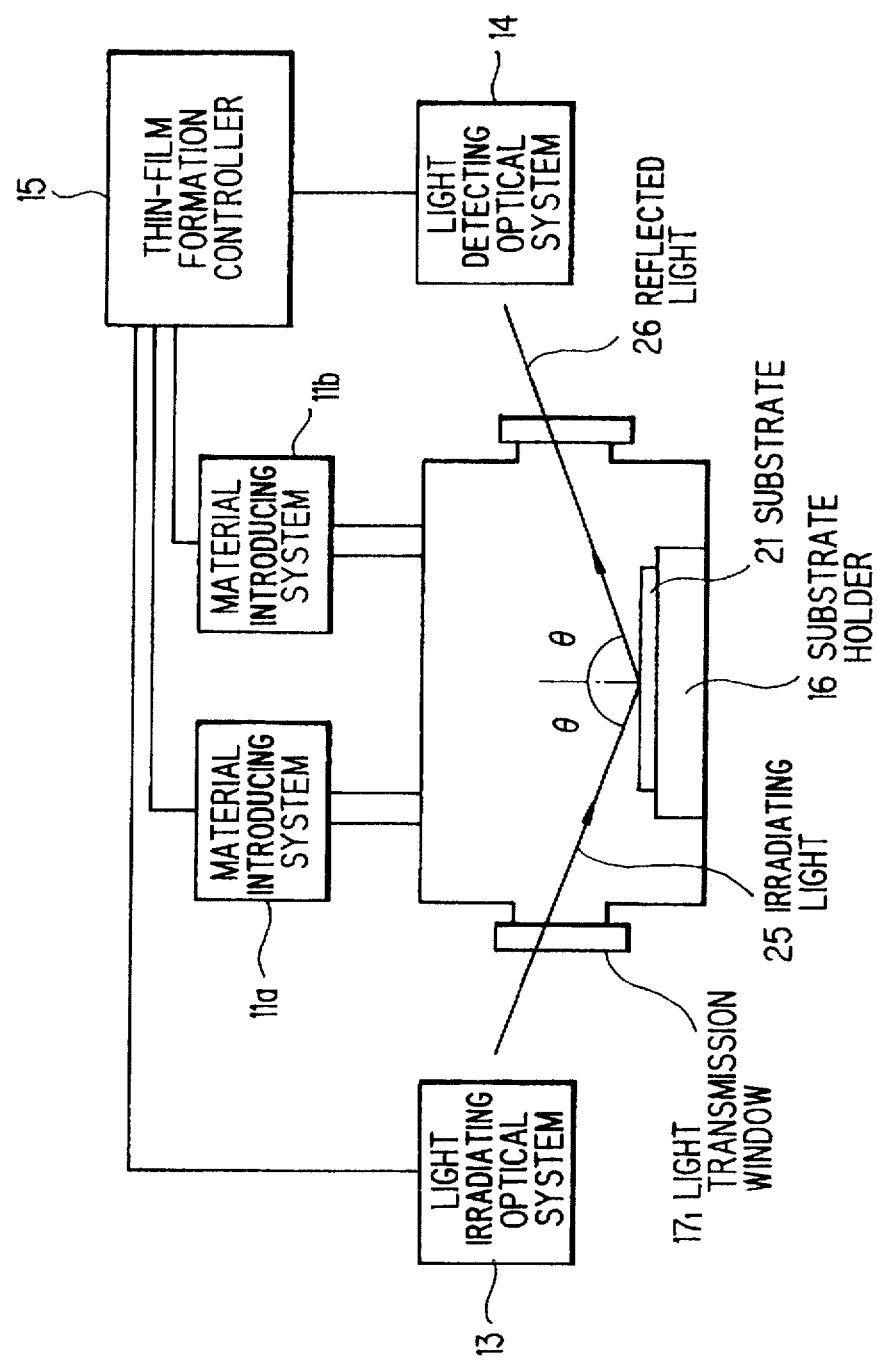
FIG. 7 is a schematic diagram showing a thin-film formation device in the second embodiment of the invention.

FIG. 7 schematically shows a thin-film formation device in the second embodiment of the invention. The device in the second embodiment can make a thicker film than that obtained by the thin-film formation device in the first embodiment and is provided with two material introducing systems 11a, 11b as shown in FIG. 7. The material introducing system 11a corresponds to the material introducing system 11 of the device in the first embodiment and contains dimethylaluminumhydride as well. The material introducing system 11b contains tetrakisdimethylaminotitanium.

The thin-film formation device in the second embodiment is operated by a thin-film formation controller 15 as follows.

When the instruction for making a thin film is given, the thin-film formation controller 15 first controls the light irradiating optical system 13 to irradiate a light to the substrate 21 as well as to start the monitoring by the light detecting optical system 14. After confirming that the light irradiating optical system 13 and the light detecting optical system 14 are regularly operated, it will control the material introducing system 11a to start the introduction of a material into the deposition chamber 12.

Thereafter, on the basis of a signal which is output from the light detecting optical system 14, it will continue to monitor the intensity of reflected light. When the intensity of reflected light reaches maximum value, the feeding of material by the material introducing system 11a will be stopped. Then the material introducing system 11b is controlled to introduce tetrakisdimethylaminotitanium into the deposition chamber 12, thereby exposing the substrate on which an aluminum film is formed into the atmosphere of tetrakisdimethylaminotitanium.

After a predetermined time of exposing to the atmosphere of tetrakisdimethylaminotitanium, the thin-film formation controller 15 stops the feeding of material from the material introducing system 11b and starts again the feeding of material from the material introducing system 11a. In the thin-film formation device in the second embodiment, such series of process is repeated a predetermined number of times to form a layered thin film.

Figure 8:
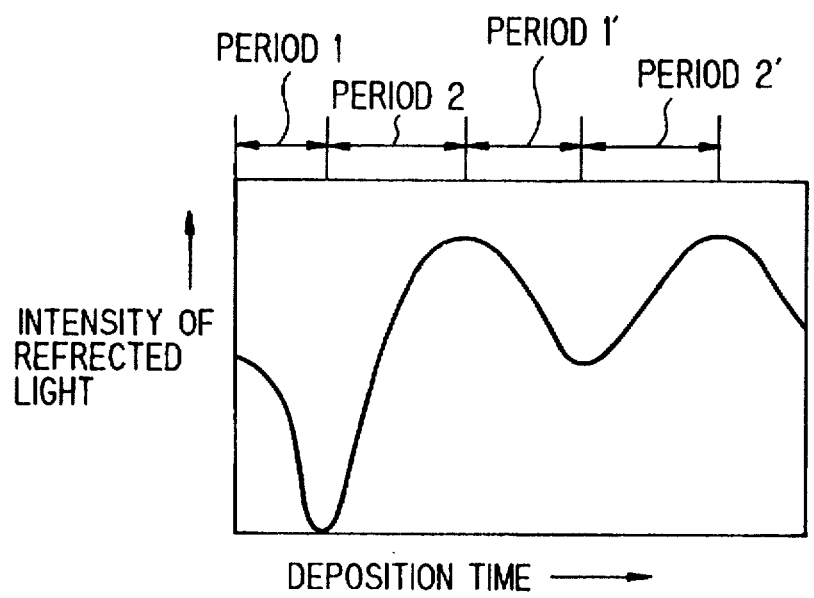
FIG. 8 is a graph showing the variation of the intensity of reflected light to deposition time when the device in the second embodiment of the invention is employed in the formation of aluminum thin film on a silicon integrated circuit.
Figure 9A:
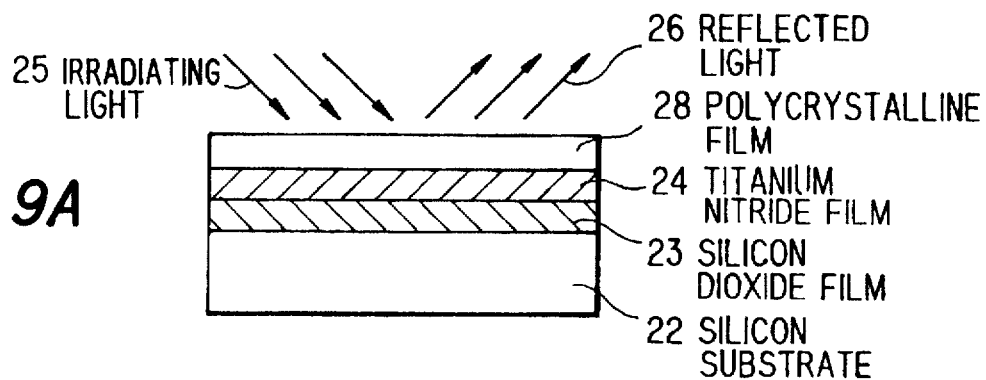
FIGS. 9A–9C are cross sectional views of a substrate showing the process in which an aluminum thin film is formed on the substrate when the device in the second embodiment of the invention is employed in the formation of aluminum thin film on a silicon integrated circuit.
Figure 9B:
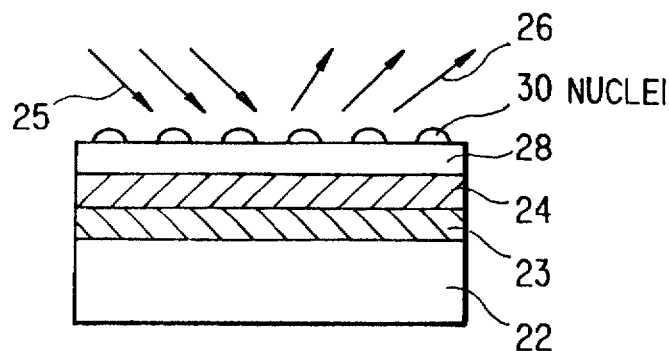
Figure 9C:
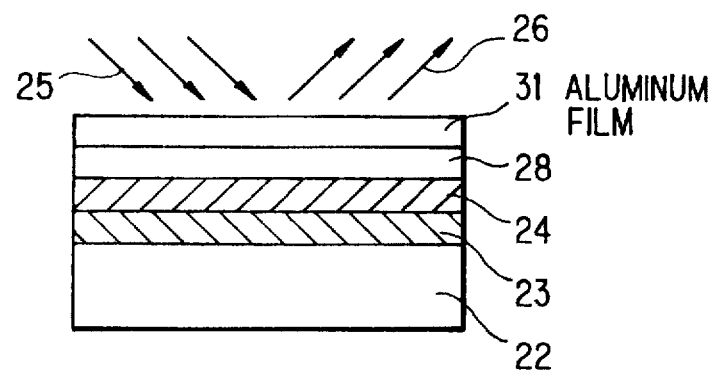

With reference to FIGS. 8 and 9A–9C, the reason why the thin-film formation device in the second embodiment can provide a thin film with a smooth surface will be explained below. FIG. 8 is a graph showing the variation of the intensity (output of the light detecting optical system) of reflected light to the deposition time when the device is applied for the formation of an aluminum thin film in a silicon integrated circuit. FIGS. 9A–9C illustrate schematically the procedures in which an aluminum thin film will be formed on the substrate.

As shown in FIG. 8, the intensity of reflected light which has a initial value on the basis of the reflection factor of the titanium nitride film takes a minimum value followed by taking a maximum value (in Period 1 and 2). While the thin-film formation device in the first embodiment is controlled to stop the film formation when the intensity of reflected light takes a maximum value, the thin-film formation device in the second embodiment begins exposing of the substrate into the atmosphere of tetrakisdimethylaminotitanium when the intensity of reflected light takes a maximum value, i.e., when a smooth surface film 28 is first obtained as illustrated in FIG. 9A. Therefore, the film formation thereafter is proceeded on an aluminum polycrystalline film 28 the surface condition of which is reformed.

From an experimental result by the inventors, in the case of exposing to the atmosphere of tetrakisdimethylaminotitanium, a number of nuclei 30 which is formed on the aluminum polycrystalline film 28 becomes larger and the size thereof becomes smaller as compared with the process without exposing to the atmosphere of tetrakisdimethylaminotitanium.

Therefore, the growth of aluminum film on the polycrystalline film is proceeded in a similar manner to the mechanism of the growth of aluminum film on the titanium nitride film. The aluminum film 31 on the polycrystalline film 28, as shown in FIG. 9C, has a smoothest surface when the whole surface of the substrate is covered therewith. The intensity of reflected light, as shown in FIG. 8, repeats the variation to the deposition time similar to that obtained when the aluminum film is grown on the titanium nitride film (refer to FIG. 8, Period 1' and 2').

As described above, in the thin-film formation device in the second embodiment, the formation of aluminum thin film is repeated by a similar mechanism to that in the formation of thin-film on the substrate, thereby easily obtaining a thicker smooth thin-film with good reproducibility than that obtained by the thin-film formation device in the first embodiment.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A thin-film formation device, comprising:

means for forming a thin film on a substrate, said thin film being formed as isolated nuclei on said substrate at least for an initial stage of growth on said substrate;

means for irradiating a light onto a surface of said substrate, said light having a wavelength selected such that transmittance of said thin film is less than a reflectivity of said thin film;

means for detecting total intensity of light reflected from the surface of said substrate free of said thin film and from a surface of said thin film formed thereon; and means for stopping formation of said thin film by said thin-film formation means when said reflected light detection means detects a maximum value of said intensity of said reflected light.

2. A thin-film formation device, according to claim 1, wherein:

said thin film formed by said thin-film formation means is polycrystalline film.

3. A thin-film formation device, according to claim 1, wherein:

said thin-film formation means performs the thin-film formation by chemical vapor deposition method.

4. A thin-film formation device, according to claim 1, wherein:

said thin film formed by said thin-film formation means is made of a material mainly including aluminum.

5. A thin-film formation device, comprising:

means for forming a first thin film on a substrate, said thin film being formed as isolated nuclei on said substrate at least for an initial stage of growth on said substrate;

means for forming a second thin film on the first thin film, said second thin film comprising a material different from that of said first thin film;

means for irradiating a light onto a surface of said substrate, said light having a wavelength selected such that transmittance of each of said thin films is less than a reflectivity of a respective thin film;

means for detecting total intensity of light reflected from the surface of said substrate free of a top thin film and from a surface of said top thin film formed thereon; and control means for stopping formation of said first thin film by said first thin-film formation means when said reflected light detection means detects a maximum value of said intensity of said reflected light, then initiating formation of said second thin film.

6. A thin-film formation device, according to claim 5, wherein:

said first thin film formed by said first thin-film formation means is polycrystalline film.

7. A thin-film formation device, according to claim 5, wherein:

said first thin-film formation means performs the first thin-film formation by chemical vapor deposition method.

8. A thin-film formation device, according to claim 5, wherein:

said first thin film formed by said first thin-film formation means is made of a material mainly including aluminum.

9. A thin-film formation device, according to claim 5, wherein:

said first thin film is made of a material mainly including aluminum and said second thin film is made of a material mainly including titanium.

10. A method for forming a thin film, comprising the steps of:

forming a thin film on a substrate, said thin film being formed as isolated nuclei on said substrate at least for an initial stage of growth on said substrate;

irradiating a light onto a surface of said substrate, said light having a wavelength selected such that transmittance of said thin film is less than a reflectivity of said thin film;

detecting an intensity of light reflected by at least one of said surface of said substrate and a surface of said thin film using means for detecting total intensity of light reflected from the surface of said substrate free of said thin film and from a surface of said thin film formed thereon; and stopping formation of said thin film when said intensity of said reflected light reaches a maximum value.

11. A method for forming a thin film, according to claim 10, wherein:

said thin film is formed as polycrystalline film.

12. A method for forming a thin film, according to claim 10, wherein:

said thin-film is formed by chemical vapor deposition method.

13. A method for forming a thin film, according to claim 10, wherein:

said thin film is made of a material mainly including aluminum.

14. A method for forming a thin film, comprising the steps of:

forming a first thin film on a substrate, said thin film being formed as isolated nuclei on said substrate at least for an initial stage of growth on said substrate;

irradiating a light to a surface of said substrate, said light having a wavelength selected such that transmittance of said thin film is less than a reflectivity of said thin film;

detecting an intensity light reflected by at least one of a surface of said first thin film, said surface of said substrate, and a surface of a second thin film using means for detecting total intensity of light reflected from the surface of said substrate free of said thin film and from a surface of said thin film formed thereon;

stopping formation of said first thin film when said intensity of said reflected light reaches a maximum value;

forming said second thin film on said first thin film, said second thin film comprising a material different from that of said first thin film; and forming a third thin film on said second thin film after forming said second thin film for a selected period of time.

15. A method for forming a thin film, according to claim 14, wherein:

said first thin film is formed as polycrystalline film.

16. A method for forming a thin film, according to claim 14, wherein:

said first thin-film is formed by chemical vapor deposition method.

17. A method for forming a thin film, according to claim 14, wherein:

said first thin film is made of a material mainly including aluminum.

18. A method for forming a thin film, according to claim 14, wherein:

said first thin film is made of a material mainly including aluminum and said second thin film is made of a material mainly including titanium.

19. A thin-film formation device, comprising:

means for forming a thin film on a substrate, said thin film being formed as isolated nuclei on said substrate at least for an initial stage of growth on said substrate;

means for irradiating a light onto a surface of said substrate, said light having a wavelength selected such that transmittance of said thin film is less than a reflectivity of said thin film;

means for detecting total intensity of light reflected from the surface of said substrate free of said thin film and from a surface of said thin film formed thereon;

said light being scattered by said nuclei to reduce an intensity of reflected light detected by said means for detecting until said nuclei coalesce to form said thin film at which time scattering is reduced and the intensity of light detected by said means for detecting increases; and means for stopping formation of said thin film by said thin-film formation means when said reflected light detection means detects a maximum value of said intensity of said reflected light, the maximum value being independent of relative reflectivities of the substrate and the thin film and dependent on a reflectivity of said coalesced nuclei.

* * * * *

UNITED STATES PATENT AND TRADEMARK OFFICE
CERTIFICATE OF CORRECTION

PATENT NO. : 5,793,479
DATED     : August 11, 1998
INVENTOR(S) : Kazumi SUGAI et al.

It is certified that error appears in the above-indentified patent and that said Letters Patent is hereby corrected as shown below:

On the cover page, change the name of the Assignee, Item [73] from "NEC Corporation, Tokyo, Japan" to --NEC Corporation, Tokyo, Japan, and ANELVA Corporation, Tokyo, Japan--.

Signed and Sealed this

Twenty-ninth Day of June, 1999

Attest:

Q. TODD DICKINSON

*Attesting Officer*     Acting Commissioner of Patents and Trademarks

UNITED STATES PATENT AND TRADEMARK OFFICE
CERTIFICATE OF CORRECTION

PATENT NO. : 5,793,479
DATED : August 11, 1998
INVENTOR(S) : Kazumi SUGAI et al.

It is certified that error appears in the above-indentified patent and that said Letters Patent is hereby corrected as shown below:

On the cover page, Item [73], change the name of the assignee from "NEC Corporation, Tokyo, Japan" to --NEC Corporation, Tokyo, Japan and ANELVA Corporation, Tokyo, Japan--.

Signed and Sealed this

Seventeenth Day of August, 1999

*Attest:*

Q. TODD DICKINSON

*Attesting Officer*      *Acting Commissioner of Patents and Trademarks*